United States Patent
Huang

(10) Patent No.: US 8,081,483 B2
(45) Date of Patent: Dec. 20, 2011

(54) USB FLASH DISK

(75) Inventor: Joseph Huang, Taoyuan (TW)

(73) Assignee: Ho E Screw & Hardware Co., Ltd., Lu-Chu, Taoyuan (TW)

( * ) Notice: Subject to any disclaimer, the term of this patent is extended or adjusted under 35 U.S.C. 154(b) by 237 days.

(21) Appl. No.: 12/640,495

(22) Filed: Dec. 17, 2009

(65) Prior Publication Data

US 2010/0290181 A1    Nov. 18, 2010

(30) Foreign Application Priority Data

May 12, 2009   (TW) ................................ 98115626 A

(51) Int. Cl.
*H05K 5/00* (2006.01)
(52) U.S. Cl. ........................................................ 361/752
(58) Field of Classification Search ............... 361/737, 361/752; 710/72–73; 439/135, 149, 353, 439/358, 660
See application file for complete search history.

(56) References Cited

U.S. PATENT DOCUMENTS

| | | | | |
|---|---|---|---|---|
| 5,673,172 A | * | 9/1997 | Hastings et al. | 361/679.34 |
| 5,835,342 A | * | 11/1998 | Hunte | 361/679.11 |
| 7,165,998 B2 | * | 1/2007 | Lee et al. | 439/660 |
| 7,341,464 B2 | * | 3/2008 | Cuellar et al. | 439/135 |
| 7,364,445 B1 | * | 4/2008 | Ni et al. | 439/140 |
| 7,394,611 B1 | * | 7/2008 | Rahgozar | 360/75 |
| 7,416,424 B1 | * | 8/2008 | Deckman | 439/135 |
| 2007/0111598 A1 | * | 5/2007 | Quilici | 439/595 |

* cited by examiner

Primary Examiner — Jeremy Norris
Assistant Examiner — Tremesha S Willis
(74) Attorney, Agent, or Firm — Guice Patents PLLC

(57) ABSTRACT

A USB flash disk is disclosed as being inserted therein with an internal structure composed of a printed circuit board, a metallic tray, a lower insulation seat and a clamping strip unit etc. for completing the USB flash disk.

9 Claims, 9 Drawing Sheets

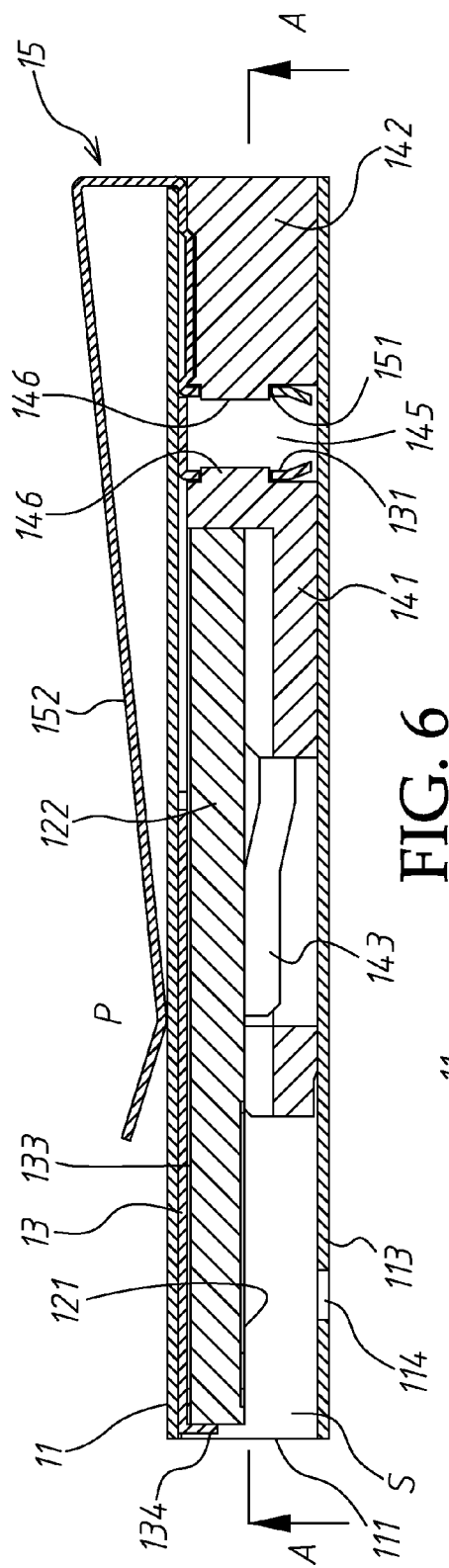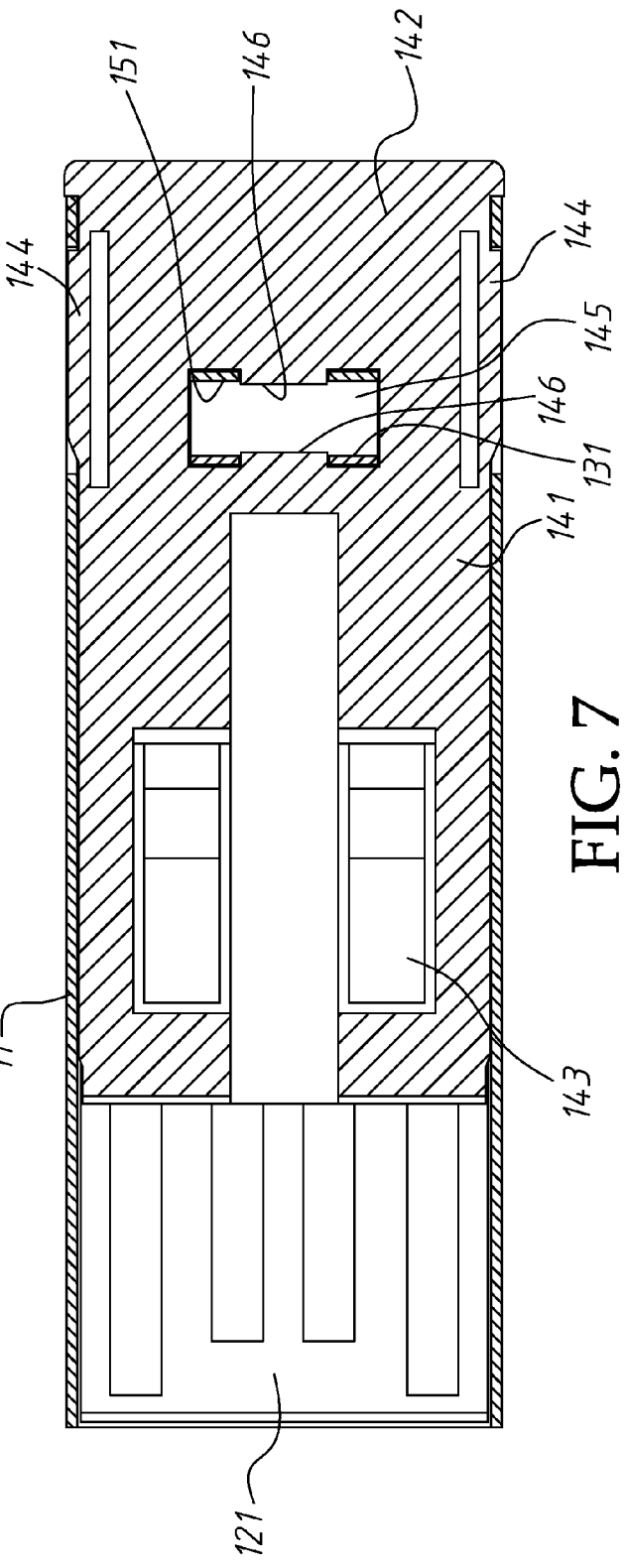

USB FLASH DISK

BACKGROUND OF THE INVENTION

1. Field of the Invention

The present invention relates to design a structure of a USB flash disk, and especially to design a USB flash disk which allows an internal printed circuit board of it to be changed, and has a clamping strip unit.

2. Description of the Prior Art

A USB flash disk is a mobile storage unit; it can be connected with a computer for access of data, and is convenient for carrying on one's person. By nonstop technical progressing, capacities of USB flash disks available nowadays increase from day to day; and scopes of application of USB flash disks are wider and wider.

A conventional USB flash disk is depicted in FIGS. 1-3, it mainly has a metallic housing 91 shaped by punch pressing, the metallic housing 91 is provided over it with a plastic housing 92. And the metallic housing 91 is provided therein with a printed circuit board 93 with a storing function which is abutted against an insulation seat 94 for being positioned.

In such a conventional structure of USB flash disk, the metallic housing 91 is shaped by continuous punch pressing from a metallic board, it is advantageous in fast production and low cost, but a joint 95 will be formed on its metallic housing 91 and make it an inferior appearance, so that it must be enveloped with a plastic sleeve 92 to give it a good appearance. Meantime, the metallic housing 91 always is subjected to deformation at the joint when it is impacted by an external force, this may break the whole USB flash disk and make it useless. Hence, such a USB flash disk needs to be improved.

And more, in such a structure of a USB flash disk, once assembling of it is completed, the insulation seat 94 and the printed circuit board 93 in the metallic housing 91 are unable to be taken out. Sometimes, when an integrated packing circuit with a memory function in the printed circuit board 93 is damaged, the entire USB flash disk will be unusable and shall be discarded. Sometimes, when capacity of a memory is desired to be increased, a conventional USB flash disk is unable to have its inner printed circuit board changed, these are defects of the conventional technique.

SUMMARY OF THE INVENTION

The present invention provides a USB flash disk, the main point is that the USB flash disk is inserted therein with an internal structure composed of a printed circuit board, a metallic tray, a lower insulation seat and a clamping strip unit etc. for completing the USB flash disk. The printed circuit board, the metallic tray and the lower insulation seat can be drawn out from the metallic housing for changing the printed circuit board.

In the USB flash disk provided in the present invention, the metallic housing is a none-joint square pipe formed by drawing shaping, its surface is smooth without a seam, thereby the structure of the metallic housing is stiffer than the conventional housing shaped by punch pressing and having a joint, the structure is not subjected to deformation. Particularly, this will render the metallic housing of the whole USB flash disk to be covered with no plastic sleeve for obscuring a joint, and thereby the cost of production of the present invention will be lowered a lot.

And more, by the fact that the metallic housing of the USB flash disk with a none-joint metallic housing provided in the present invention is a none-joint square pipe, the none-joint square pipe is made by drawing shaping and is cut to get a size desired, then the internal elements including the printed circuit board, the metallic tray and the insulation lower seat are inserted in a rear opening of the metallic housing, such assembling is very fast and the size of the metallic housing is very precise. And more, the surface of the metallic housing can be treated with electro-plating, printing, laser carving or marked with a logo to get a beautiful appearance; in production, the metallic housing has much more variant features than conventional USB flash disks.

In the USB flash disk with a none-joint metallic housing provided in the present invention, the insulation lower seat can be made of transparent material, in order that the light beams of an indication light on the printed circuit board can be projected out of a rear end of the lower seat.

The clamping strip unit in the USB flash disk with a none-joint metallic housing provided in the present invention can be substituted by a clamping device to be used as a necktie clip etc.

The present invention will be apparent in its structural features and effects of using after reading the detailed description of the preferred embodiment thereof in reference to the accompanying drawings.

BRIEF DESCRIPTION OF THE DRAWINGS

FIG. 6 is a sectional view of the present invention;

FIG. 7 is a sectional view taken from a sectional line A-A in FIG. 6;

DETAILED DESCRIPTION OF THE PREFERRED EMBODIMENT

Figure 1:
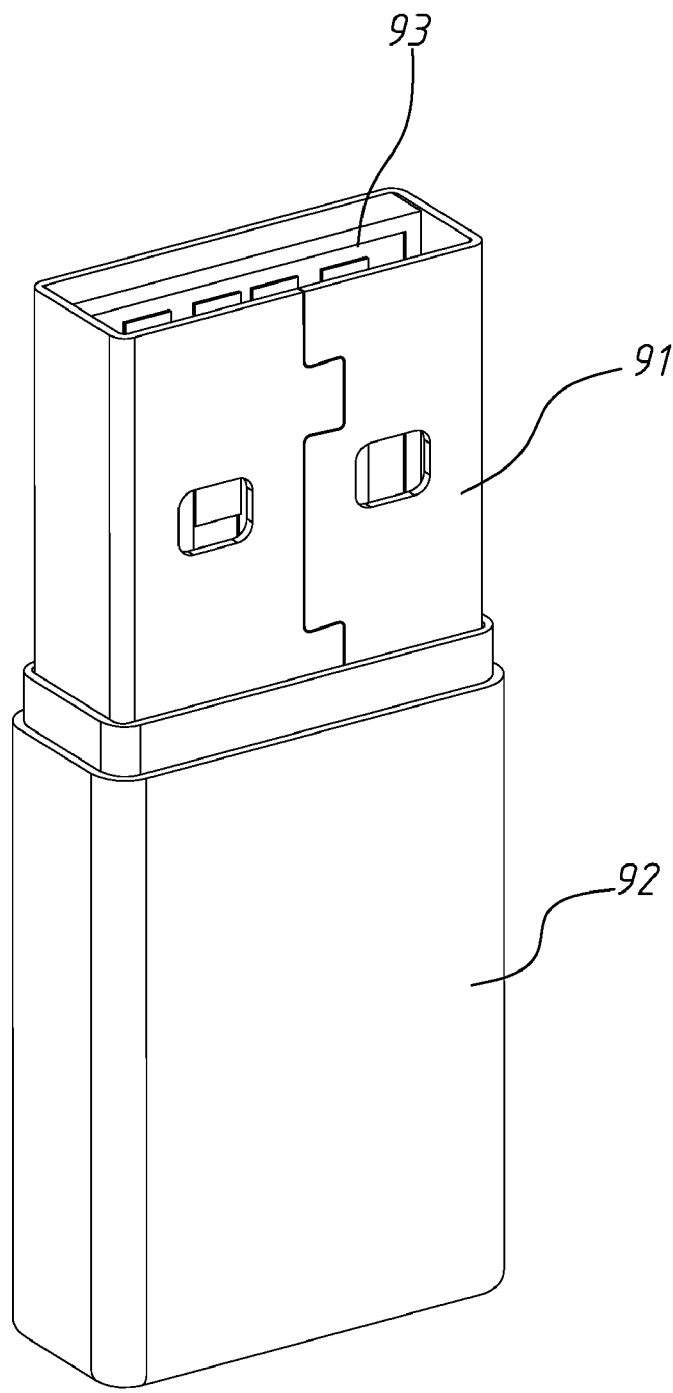
FIG. 1 is a perspective view showing the appearance of a conventional USB flash disk.
Figure 2:
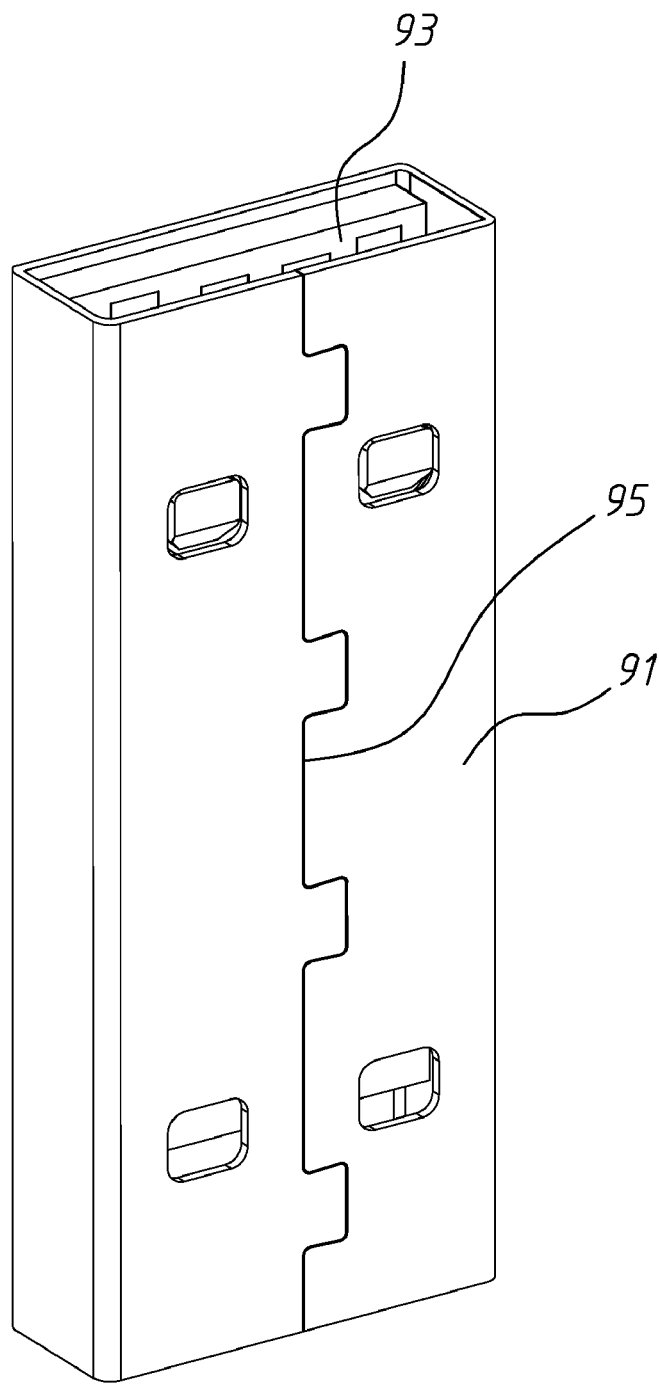
FIG. 2 is a perspective view of the conventional USB flash disk of FIG. 1 having its plastic housing removed.
Figure 3:
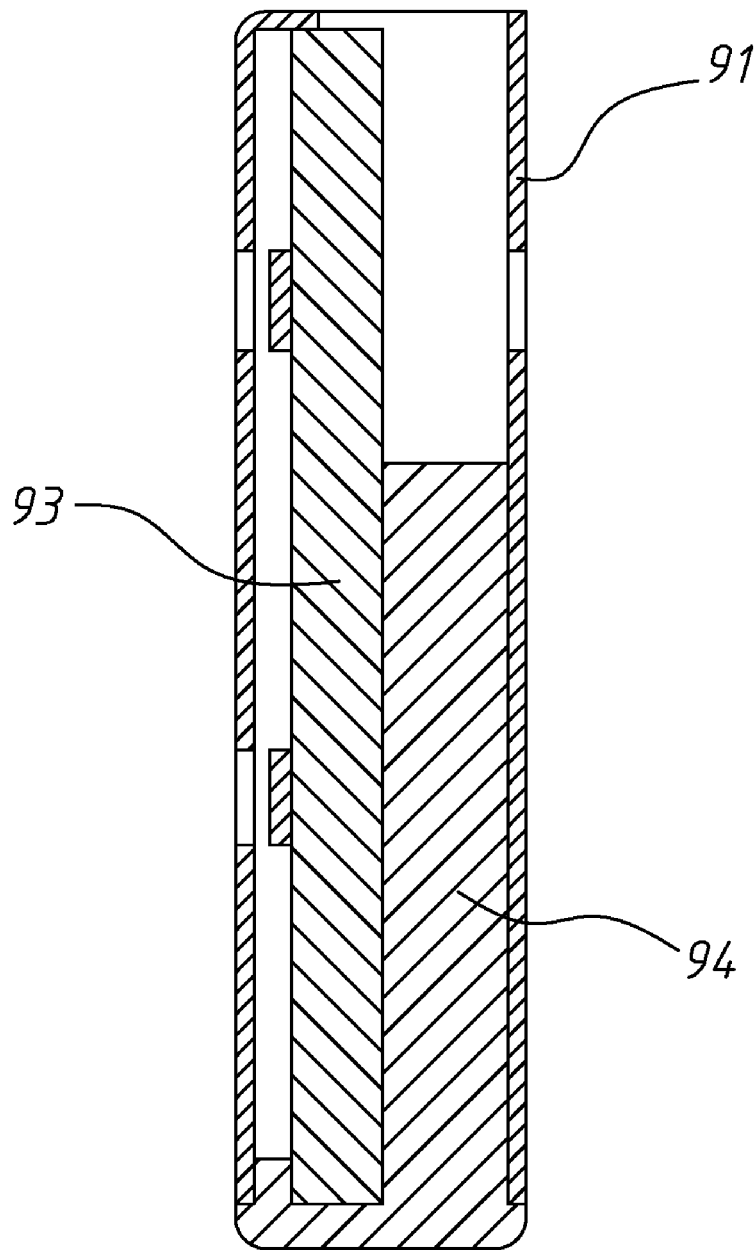
FIG. 3 is a sectional view taken from FIG. 1.
Figure 4:
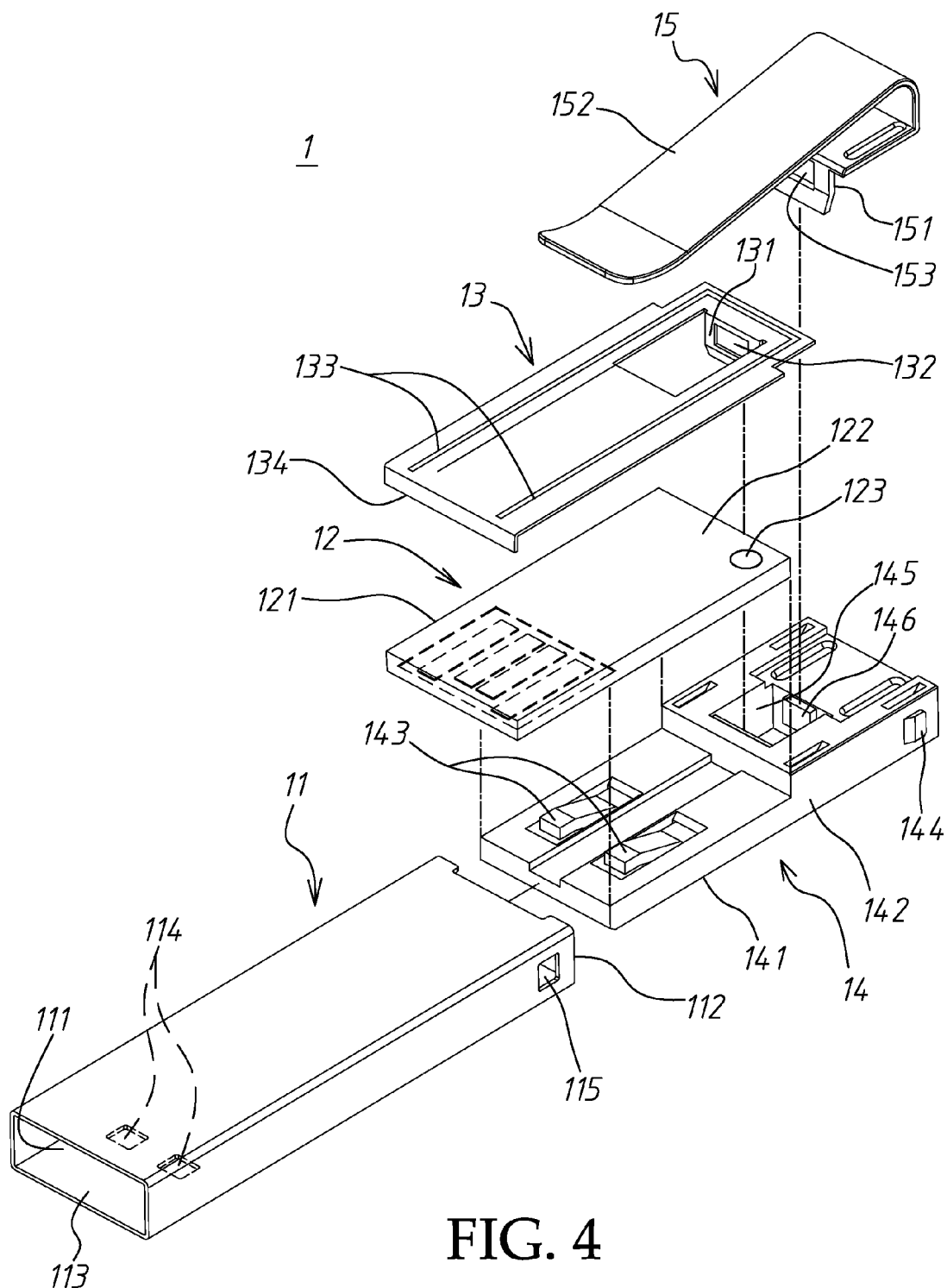
FIG. 4 is an anatomic perspective view of the present invention.

Referring to FIGS. 4-7 showing a USB flash disk 1 provided in the present invention which mainly is composed of a metallic housing 11, a printed circuit board 12, a metallic tray 13, an insulation lower seat 14 and a clamping strip unit 15.

The metallic housing 11 is a none-joint square pipe formed by drawing shaping, it has a front opening 111 and a rear opening 112, and has a pair of indentations 114 provided on its bottom surface 113 near the front opening 111. The metallic housing 11 is provided on its two lateral sides each with a through hole 115.

The printed circuit board 12 has a USB interface circuit 121 and an integrated packing circuit 122 having a function of memory, the USB interface circuit 121 is provided in front of the integrated packing circuit 122. The printed circuit board 12 further has an indication light 123.

The metallic tray 13 is provided above the printed circuit board 12 to be supported on whole of the top of the printed circuit board 12. And the metallic tray 13 is provided near its rear edge with an upright engaging piece 131 having thereon an engaging hole 132. The metallic tray 13 is provided with two protruding ribs 133 to make higher of the printed circuit board 12; and is formed at its front edge an upright flange 134 for stopping a front end of the printed circuit board 12.

The insulation lower seat 14 is connected with the metallic tray 13, and is provided with a thinner front section 141 and a thicker rear section 142. The front section 141 envelops the outer surfaces of the integrated packing circuit 122 of the printed circuit board 12, while the rear section 142 extends over the rear edge of the printed circuit board 12. The front section 141 of the insulation lower seat 14 is provided with an elastic unit 143 which includes a pair of elastic strips for pressing the printed circuit board 12 to make tight connection of the printed circuit board 12 with the metallic tray 13. The rear section 142 of the insulation lower seat 14 is provided on its two lateral sides each with a protrusion 144 to be engaged respectively in the through holes 115 on the two lateral sides of the metallic housing 11 such as shown in FIG. 7. The rear section 142 of the insulation lower seat 14 is provided with a cut opening 145 at a position corresponding with that of the upright engaging piece 131, the cut opening 145 is formed therein on each of its front and its rear sides a protruding engaging cube 146, the upright engaging piece 131 is extended into the cut opening 145, the engaging hole 132 is engaged with the protruding engaging cube 146 such as are shown in FIG. 6.

The clamping strip unit 15 has a connecting portion 151 and a bended clamping strip 152. The connecting portion 151 is provided thereon with an engaging hole 153 to be engaged with a rear engaging cube 146 provided in the cut opening 145 of the insulation lower seat 14, the bended clamping strip 152 extends on the surface of the metallic housing 11, the USB flash disk 1 can be clamped on a sheet member by contact of the bended clamping strip 152 with the metallic housing 11 at a contact point P such as is shown in FIG. 6.

In the present invention, the printed circuit board 12 is enveloped with the metallic tray 13 and the insulation lower seat 14, and is fixed in the metallic housing 11, the USB interface circuit 121 is allocated in the front opening 111 and leaves a space S between it and a bottom surface 113 (please also refer to FIG. 6), while the rear opening 112 is closed with the rear section 142 of the insulation lower seat 14.

Figure 5:
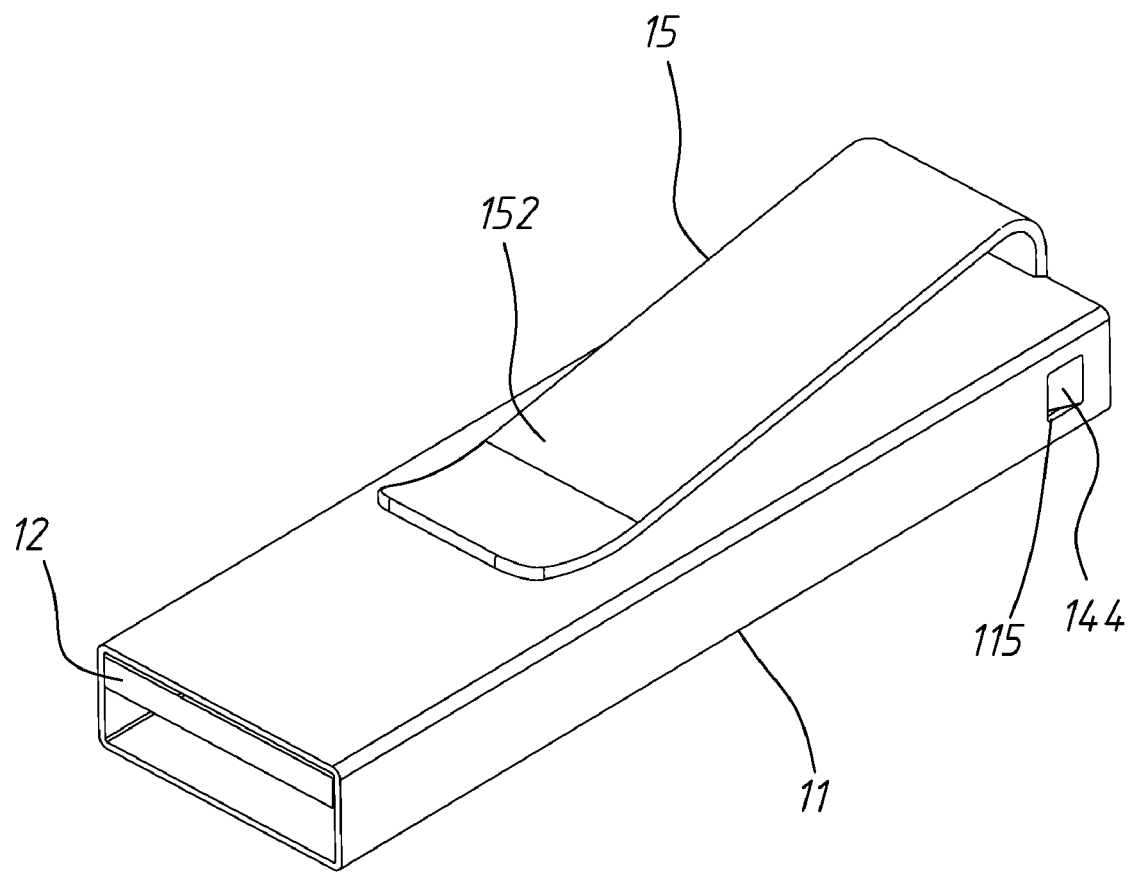
FIG. 5 is a perspective schematic view showing the present invention after assembling.

In assembling the present invention, the printed circuit board 12 is placed in advance below the metallic tray 13, then the insulation lower seat 14 is taken to cover upwardly the printed circuit board 12, and the clamping strip unit 15 is taken to be mounted on the metallic tray 13, meantime the upright engaging piece 131 and the connecting portion 151 are extended into the cut opening 145, to make the engaging holes 132, 153 respectively of the upright engaging piece 131 and the connecting portion 151 engaged with the front and the rear protruding engaging cubes 146 of the cut opening 145. Then the printed circuit board 12, the metallic tray 13 and the insulation lower seat 14 being assembled together are inserted into the rear opening 112 of the metallic housing 11 to render the protrusions 144 on the two lateral sides of the insulation lower seat 14 to be engaged in the through holes 115 of the metallic housing 11 respectively, the bended clamping strip 152 of the clamping strip unit 15 is allocated outside of the metallic housing 11 such as is shown in FIG. 5, to complete assembling of the whole USB.

After assembling of the present invention, if the printed circuit board 12 is damaged, or it is desired to change the printed circuit board 12 for one having bigger storage capacity, we need only to press the protrusions 144 to make the latter get released from the through holes 115 to draw out other elements in the metallic housing 11, then to separate the insulation lower seat 14 from the metallic tray 13, now the printed circuit board 12 can be changed for a new one, and then carry out reassembling following the above stated procedure.

The metallic housing 11 of the present invention is a none-joint rectangular pipe formed by drawing shaping, the surface of it is smooth without a seam, thereby the structure of the metallic housing 11 is stiffer than the conventional housing shaped by punch pressing and having a joint, the structure is not subjected to deformation. Particularly, this will render the metallic housing 11 of the whole USB flash disk 1 to be covered with no plastic sleeve for obscuring the joint, and thereby the cost of production of the present invention will be lowered a lot.

Figure 8:
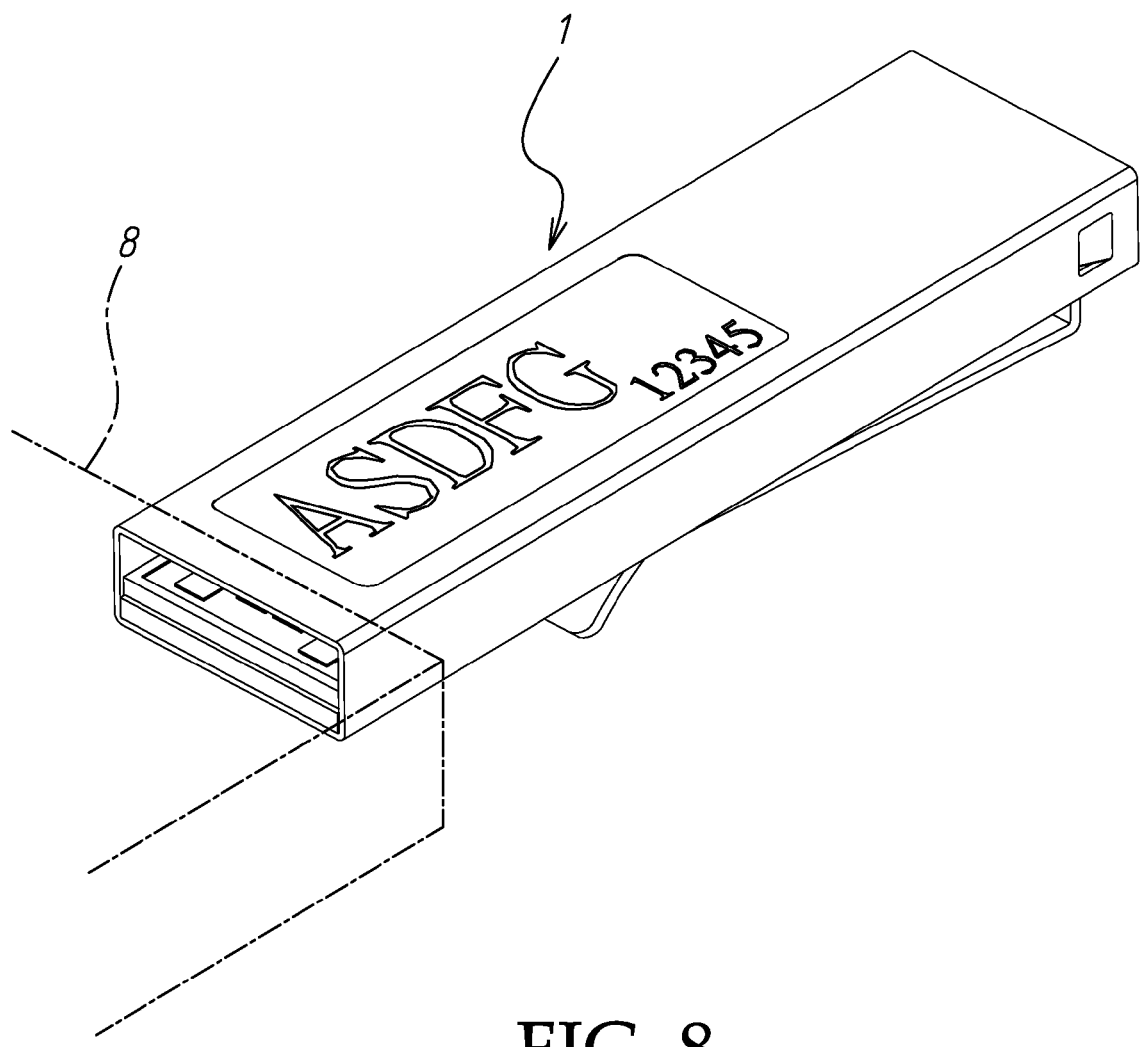
FIG. 8 is a schematic view showing use of the present invention on a computer.

And more, by the fact that the metallic housing 11 is a none-joint rectangular pipe, it is formed by drawing shaping and then is cut to get a size desired, then the internal elements including the printed circuit board 12, the metallic tray 13 and the insulation lower seat 14 are inserted in a rear opening 112 of the metallic housing 11, such assembling is very fast and the size of the metallic housing 11 is very precise. And more, the surface of the metallic housing 11 can be treated with electro-plating, printing, laser carving or marked with a logo to get a beautiful appearance such as is shown in FIG. 8; the metallic housing 11 thus is suitable to be inserted in a jack of a USB of a computer 8 for use; in production, the metallic housing 11 has much more variant features than conventional USB flash disks.

The insulation lower seat 114 in the present invention can be made of transparent material, in order that the light beams of the indication light 123 on the printed circuit board 12 can be projected out of a rear end 142 of the insulation lower seat 14.

Figure 9:
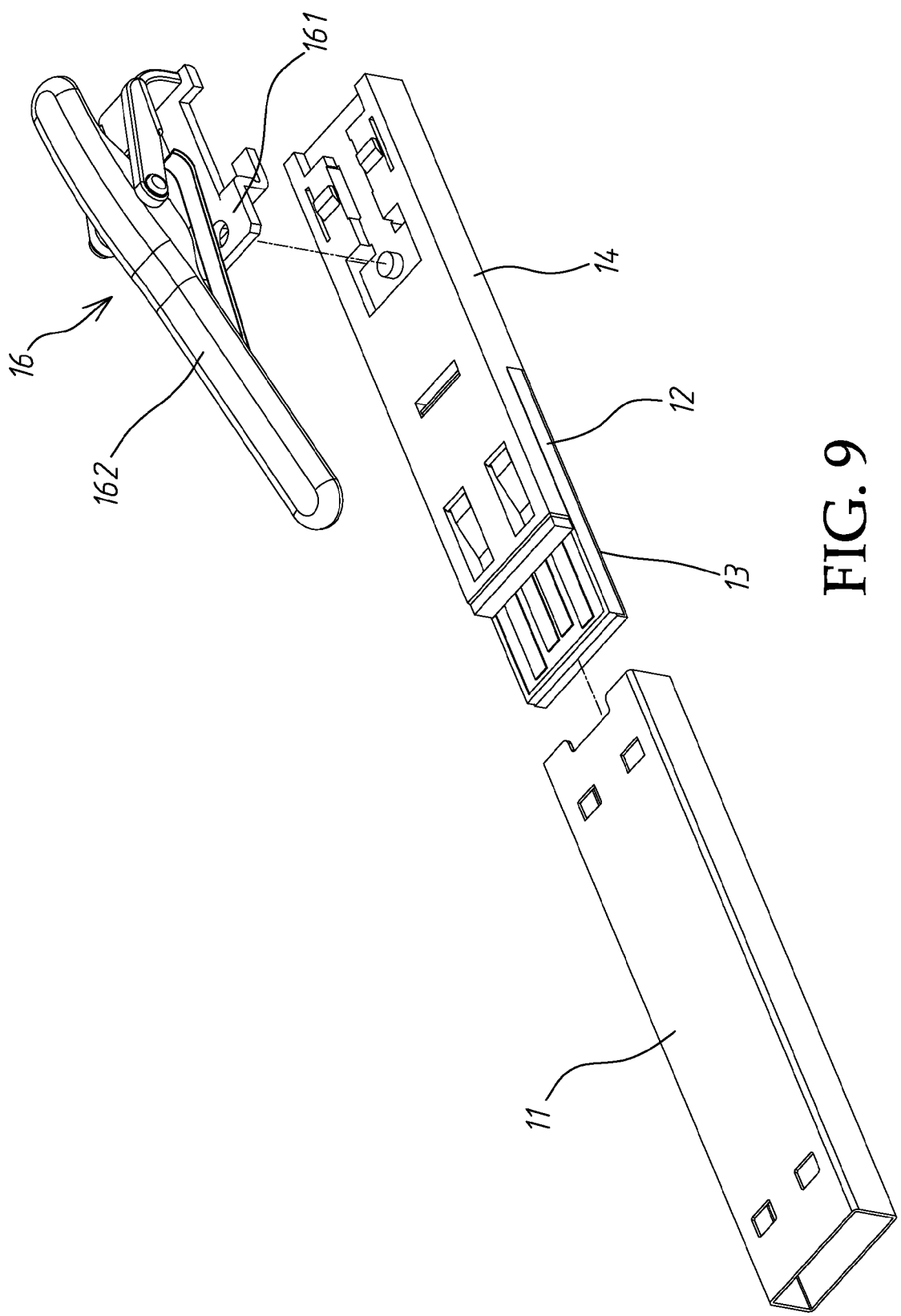
FIG. 9 is an anatomic perspective view of another embodiment of the present invention.
Figure 10:
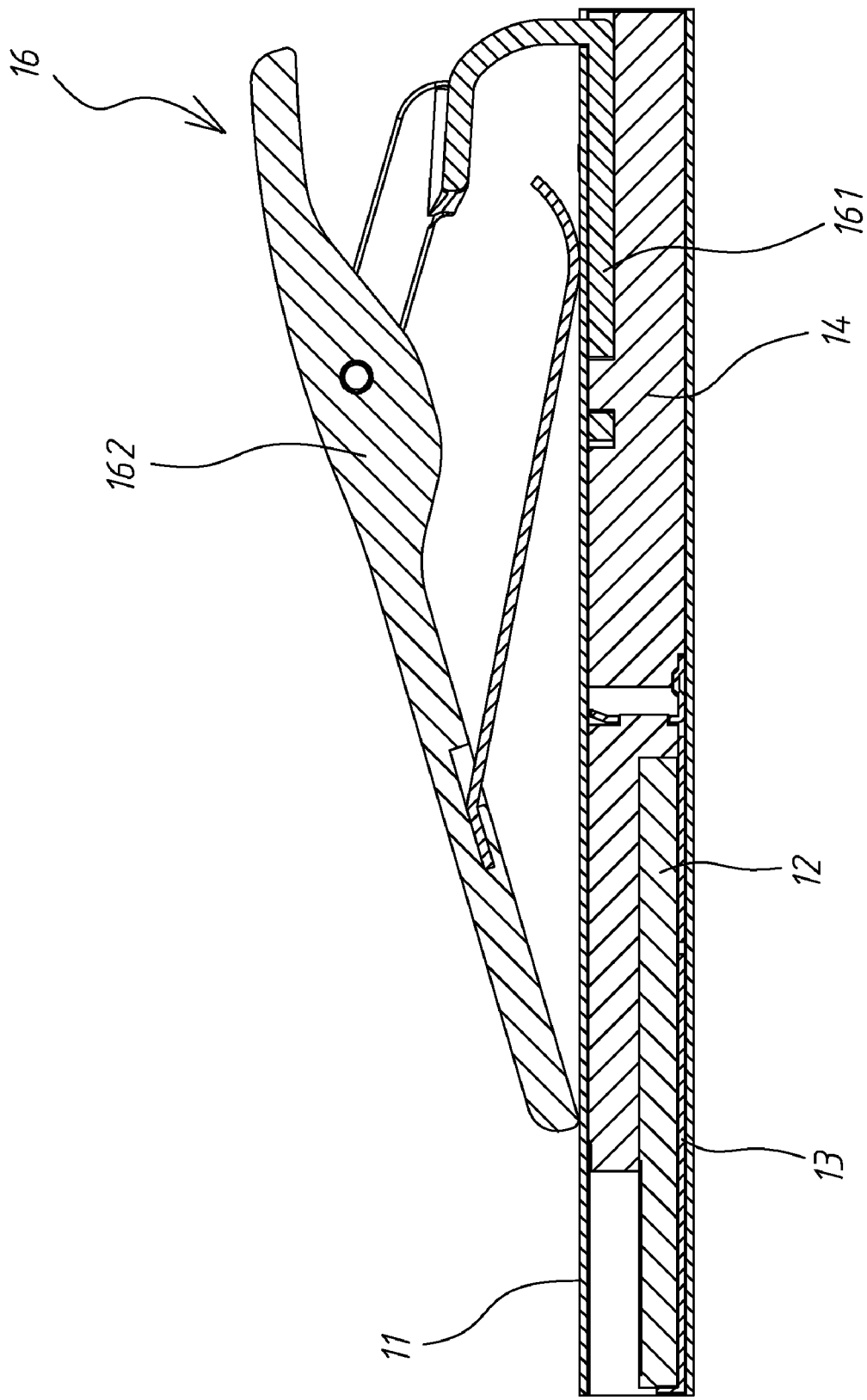
FIG. 10 is a sectional view of the second embodiment of the present invention.

As shown in FIGS. 9 and 10 which show a second embodiment of the present invention, the embodiment includes a clamping device 16 having a connecting portion 161 and a clamping member 162, the clamping device 16 is connected with the insulation lower seat 14, while the clamping member 162 is provided on the surface of the metallic housing 11, hence the USB flash disk 1 can be used as a necktie clip.

In conclusion, the brand new structure of USB flash disk of the present invention truly meets the elements of having the nature of novelty and improvement of a patent; and having thus described the present invention which meets the conditions of patentability, what I claim as new and desire to be secured by Letters Patent of the United States are:

The invention claimed is:
1. A USB flash disk comprising:
a metallic housing having a front opening and a rear opening, further having a pair of indentations provided on its bottom surface near said front opening;
a printed circuit board having at least a USB interface circuit and an integrated packing circuit with a memory function, said USB interface circuit is provided in front of said integrated packing circuit;
a metallic tray provided above said printed circuit board to be supported on whole of a top of said printed circuit board;
an insulation lower seat connected with said metallic tray, and provided with a thinner front section and a thicker rear section, said front section envelops outer surfaces of said integrated packing circuit of said printed circuit board, while said rear section extends over a rear edge of said printed circuit board;
a clamping strip unit having a connecting portion connecting with said insulation lower seat, and a bended clamping strip extending on a surface of said metallic housing;

said printed circuit board is enveloped with said metallic tray and said insulation lower seat, and is fixedly mounted in said metallic housing, said USB interface circuit is allocated on a bottom surface in said front opening and leaves a space between it and a bottom surface, while said rear opening is closed with said rear section of said insulation lower seat.

2. The USB flash disk as claimed in claim 1, wherein said insulation lower seat is provided at least with an elastic unit which presses said printed circuit board to make tight connection of said printed circuit board with said metallic tray.

3. The USB flash disk as claimed in claim 1, wherein said metallic tray is provided at its rear edge with an upright engaging piece having thereon an engaging hole; a rear section of said insulation lower seat is provided with a cut opening at a position corresponding with that of said upright engaging piece, said cut opening is formed therein on its front side a protruding engaging cube, said upright engaging piece is extended into said cut opening, said engaging hole is engaged with said protruding engaging cube.

4. The USB flash disk as claimed in claim 1, wherein a rear section of said insulation lower seat is provided on its two lateral sides each with a protrusion to be engaged respectively in two through holes on two lateral sides of said metallic housing.

5. The USB flash disk as claimed in claim 1, wherein said printed circuit board further has an indication light, said insulation lower seat is made of transparent material, in order that light beams of said indication light are projected out of a rear end of said insulation lower seat.

6. The USB flash disk as claimed in claim 1, wherein said metallic tray is provided at least with two protruding ribs to make higher of said printed circuit board.

7. The USB flash disk as claimed in claim 1, wherein said metallic tray is formed at its front edge an upright flange for stopping a front end of said printed circuit board.

8. The USB flash disk as claimed in claim 1, wherein a clamping device is provided to be substituted for said clamping strip unit, said clamping strip unit has a connecting portion connected with said insulation lower seat, while a clamping member is provided on a surface of said metallic housing, hence said USB flash disk is adapted for using as a necktie clip.

9. The USB flash disk as claimed in claim 1, wherein said metallic housing is a none-joint square pipe formed by drawing shaping.

* * * * *